(12) United States Patent
Kreklow

(10) Patent No.: US 11,417,977 B2
(45) Date of Patent: Aug. 16, 2022

(54) CIRCUIT BOARD WITH A CONNECTOR CONNECTION AND ELECTRICAL CONNECTOR ARRANGEMENT WITH SUCH A CIRCUIT BOARD

(71) Applicant: IMS Connector Systems GmbH, Loeffingen (DE)

(72) Inventor: Kevin Kreklow, Freiburg (DE)

(73) Assignee: IMS CONNECTOR SYSTEMS GMBH, Loeffingen (DE)

( * ) Notice: Subject to any disclaimer, the term of this patent is extended or adjusted under 35 U.S.C. 154(b) by 0 days.

(21) Appl. No.: 17/326,849

(22) Filed: May 21, 2021

(65) Prior Publication Data
US 2021/0376511 A1    Dec. 2, 2021

(30) Foreign Application Priority Data
May 26, 2020    (DE) .................... 10 2020 114 114.9

(51) Int. Cl.
*H01R 9/05* (2006.01)
*H01R 13/05* (2006.01)
*H01R 12/71* (2011.01)
*H05K 1/11* (2006.01)

(52) U.S. Cl.
CPC .......... *H01R 13/052* (2013.01); *H01R 12/71* (2013.01); *H05K 1/119* (2013.01); *H05K 2201/09754* (2013.01)

(58) Field of Classification Search
CPC .... H01R 24/58; H01R 13/53; H01R 2103/00; H01R 9/0518; H01R 23/7073; H01R 11/282
See application file for complete search history.

(56) References Cited

U.S. PATENT DOCUMENTS

| | | | | |
|---|---|---|---|---|
| 4,937,404 A * | 6/1990 | Kitagawa | ........... | H01R 13/7035 200/51.09 |
| 5,775,927 A * | 7/1998 | Wider | ................. | H01R 24/542 439/944 |
| 6,296,492 B1 * | 10/2001 | Fujimoto | ........... | H01R 13/6315 439/63 |
| 6,533,593 B1 * | 3/2003 | Ishii | ....................... | H01R 24/46 200/51.1 |

(Continued)

FOREIGN PATENT DOCUMENTS

| DE | 102005002707 A1 | 7/2006 |
|---|---|---|
| DE | 102018100557 A1 | 6/2019 |

(Continued)

OTHER PUBLICATIONS

Office Action dated May 10, 2021 in DE 10 2020 114 114.9.

*Primary Examiner* — Phuong Chi Thi Nguyen
(74) *Attorney, Agent, or Firm* — Panitch Schwarze Belisario & Nadel LLP

(57) ABSTRACT

A circuit board with a connector connection for the direct contacting with a connector, wherein the connector connection is formed on the front side of the circuit board with a contact pin that is arranged centrally in a blind hole while forming a circular ring-shaped cylindrical insertion space and that has an inner hole with a first contact zone of an inner conductor for contacting an inner conductor of the connector. A second contact zone of an outer conductor is arranged in the insertion space for contacting an outer conductor of the connector.

10 Claims, 3 Drawing Sheets

(56) References Cited

U.S. PATENT DOCUMENTS

| | | | |
|---|---|---|---|
| 9,543,717 B2 * | 1/2017 | Sun | H01R 13/7033 |
| 2002/0025707 A1 * | 2/2002 | Hida | H01R 24/46 |
| | | | 439/188 |
| 2003/0013326 A1 | 1/2003 | Cox et al. | |
| 2006/0185892 A1 | 8/2006 | Guengerich et al. | |
| 2009/0149086 A1 | 6/2009 | Dahms | |
| 2009/0223708 A1 | 9/2009 | Yagisawa | |
| 2021/0194159 A1 | 6/2021 | Gruber et al. | |

FOREIGN PATENT DOCUMENTS

| | | |
|---|---|---|
| EP | 2244291 A1 | 10/2010 |
| WO | 2010131912 A2 | 11/2010 |
| WO | 2020099375 A1 | 5/2020 |

\* cited by examiner

CIRCUIT BOARD WITH A CONNECTOR CONNECTION AND ELECTRICAL CONNECTOR ARRANGEMENT WITH SUCH A CIRCUIT BOARD

CROSS-REFERENCE TO RELATED APPLICATION

This application claims priority under 35 U.S.C. § 119 to German Patent Application No. 10 2020 114 114.9, filed on May 26, 2020, the disclosure of which is incorporated herein by reference in its entirety.

BACKGROUND OF THE INVENTION

The invention relates to a circuit board with a connector connection for the direct contacting with a connector, as well as an electrical connector arrangement with such a circuit board and a connector connected directly to this circuit board.

For the electrical connection of adjacent and parallel circuit boards, connectors are used that are mounted on opposing faces of the circuit boards. Such connectors, which are called B2B (board-to-board) connectors, consist of three connector parts, namely two sockets each mounted on one of the circuit boards and an adapter (also called a bullet), which is formed as a plug at both ends. Such an adapter can be used to compensate not only for tolerances with respect to the distance between the circuit boards to be connected, but also for a lateral offset with respect to the longitudinal axes of the two sockets. The three-part design of such B2B connectors can be considered a disadvantage.

An electrical connector, which realizes, together with a mating connector, a B2B plug-in connection, is known, for example, from DE 10 2018 113 278 B3. This known B2B plug-in connection consists of only two connector parts, namely the electrical connector and the mating connector. The electrical connector is mechanically and electrically connected to a circuit board by means of a flange that widens in the shape of a funnel and that is arranged at the end of a sleeve forming an outer conductor, while the mating connector is likewise mechanically and electrically connected to another circuit board by means of a flange that widens in the shape of a funnel and that is arranged at the end of a sleeve forming an outer conductor. Tolerances in the lateral offset of the axes are compensated in the electrical connector by means of a flexible bending section of its sleeve.

BRIEF SUMMARY OF THE INVENTION

The invention is based on the problem of creating a circuit board which makes it possible to enable direct contacting with an electrical connector. The problem of the invention is also to disclose an electrical connector arrangement with this circuit board for creating direct contacting with an electrical connector.

The problem mentioned first is solved by a circuit board with the features of patent claim 1.

Such a circuit board comprises a connector connection for the direct contacting with a connector, wherein the connector connection is formed on the front side of the circuit board with a contact pin that is arranged centrally in a blind hole while forming a circular ring-shaped cylindrical insertion space and has an inner hole with a first contact zone of an inner conductor for contacting an inner conductor of the connector, and a second contact zone of an outer conductor arranged in the insertion space for contacting an outer conductor of the connector.

With such a circuit board according to the invention, the connector connection is connected mechanically and electrically directly to a connector. The connector is in turn connected mechanically to another circuit board by means of a flange arranged on the opposite end of its sleeve for realizing a B2B plug-in connection, so that only a single connector part is required.

For this circuit board according to the invention, the connector connection takes on the function of a socket for the connector. According to the invention, the connector connection has an insertion space, in which the plug end of the connector is inserted, so that a mechanical and electrical connection can be produced between the contact zones of the corresponding outer conductors on one side and between the contact zones of the corresponding inner conductors on the other side.

For this purpose, according to an advantageous refinement of the invention, the insertion space has a contact section with the second contact zone and a funnel section with a chamfer that widens in the radial direction toward the front side of the circuit board. Preferably, the contact pin is formed with the length of the contact section of the insertion space. By means of the funnel section, the plug end of the connector can be manually inserted into the insertion space in an improved way.

According to another preferred embodiment of the invention, it is provided that the inner conductor is routed to a conductor path plane opposite the front side of the circuit board and is electrically connected to a conductor path of the conductor path plane. This conductor path plane can be realized as an embedded conductor path plane of a multilayer circuit board or a conductor path plane on the reverse side of the circuit board opposite the front side.

Furthermore, it is advantageous if, according to another embodiment of the invention, the second contact zone is arranged at least on the outer lateral surface of the circular ring-shaped cylindrical insertion space. In this way, a more secure electrical contact to the sleeve of a connector forming an outer conductor can be guaranteed, because usually this electrical contact is realized by means of a resilient section of the sleeve having a circumferential bead.

In addition, it is advantageous according to the refinement if the outer conductor is routed to a conductor path plane opposite the front side of the circuit board and is connected electrically to a conductor path of this conductor path plane. This conductor path plane can be realized as an embedded conductor path plane of a multilayer circuit board or can have a conductor path on the reverse side of the circuit board opposite the front side.

To make manual handling for inserting the plug end of the connector into the connector connection easier, the inner hole of the contact pin is formed with a radially widening chamfer at the end.

To ensure a secure mechanical and electrical contact of the connector with the connector connection of the circuit board, the radial width of the circular ring-shaped cylindrical insertion space for producing a resilient plug-in contact is adapted to the sleeve forming the outer conductor of the connector.

The second problem is solved by an electrical connector arrangement with the features of patent claim 9.

Such an electrical connector arrangement with a circuit board according to the invention and a connector connected to the connector connection of the circuit board is distinguished in that for contacting the first contact zone of the connector connection, the connector has an inner conductor designed as an inner conductor pin for insertion into the inner hole of the contact pin of the connector connection, the connector has an outer conductor formed as a sleeve with a contact zone for contacting the second contact zone of the connector connection, and the connector has a dielectric body with an inner hole for accommodating the inner conductor pin, wherein the dielectric body is arranged in the sleeve.

For this electrical connector arrangement according to the invention, no mating connector to be arranged on the circuit board is required for the connector, as is proposed in DE 10 2018 113 278 B3 described above. The connector described there is connected to the connector connection of the circuit board, wherein its free end is preferably connected mechanically by means of a flange of its sleeve directly to another circuit board for creating a B2B plug-in connection.

BRIEF DESCRIPTION OF THE SEVERAL VIEWS OF THE DRAWING

The foregoing summary, as well as the following detailed description of the preferred invention, will be better understood when read in conjunction with the appended drawings. For the purpose of illustrating the preferred invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
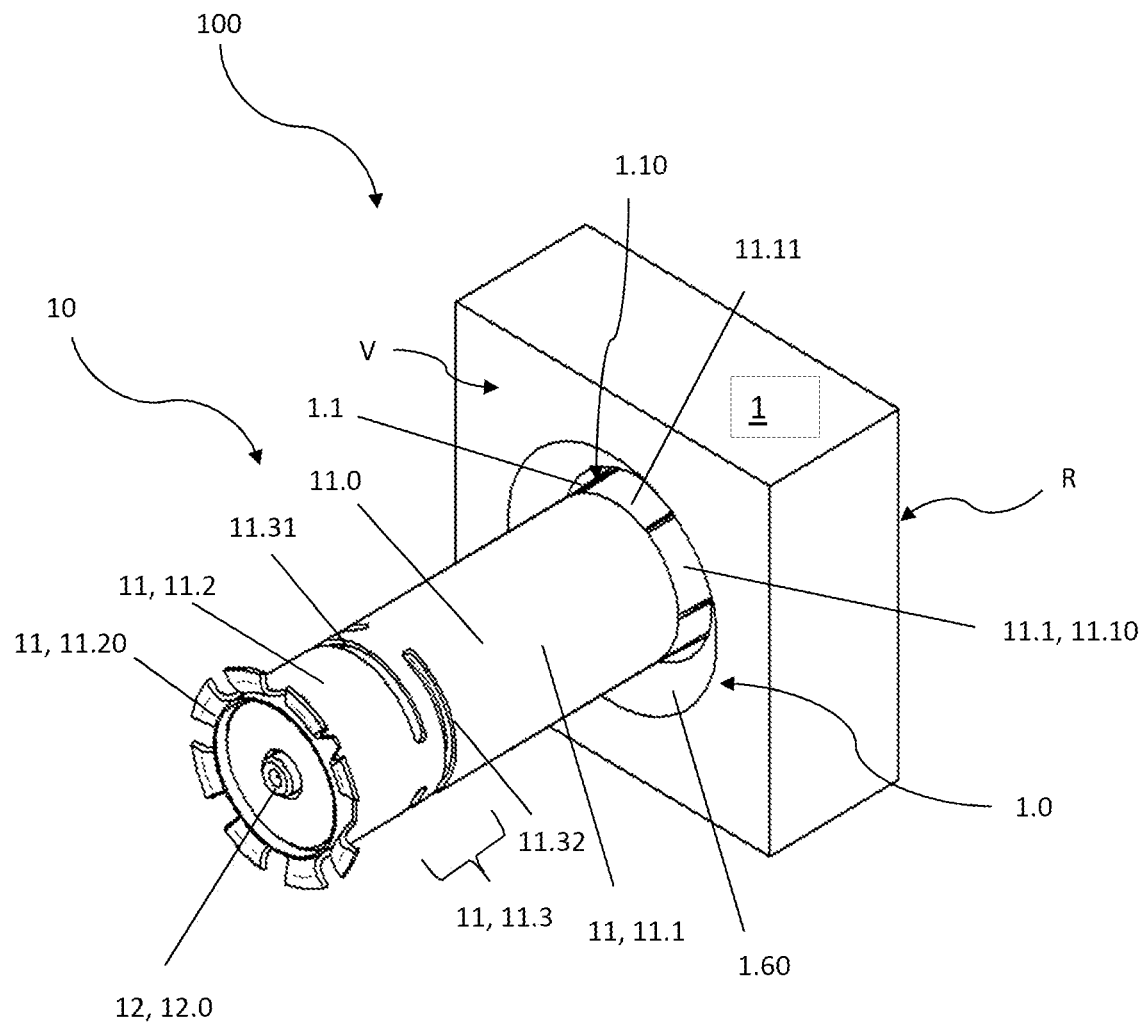
FIG. 1 is a side perspective view of an electrical connector arrangement consisting of a circuit board and a connector connected directly to this circuit board, in accordance with a preferred embodiment of the present invention.
Figure 2:
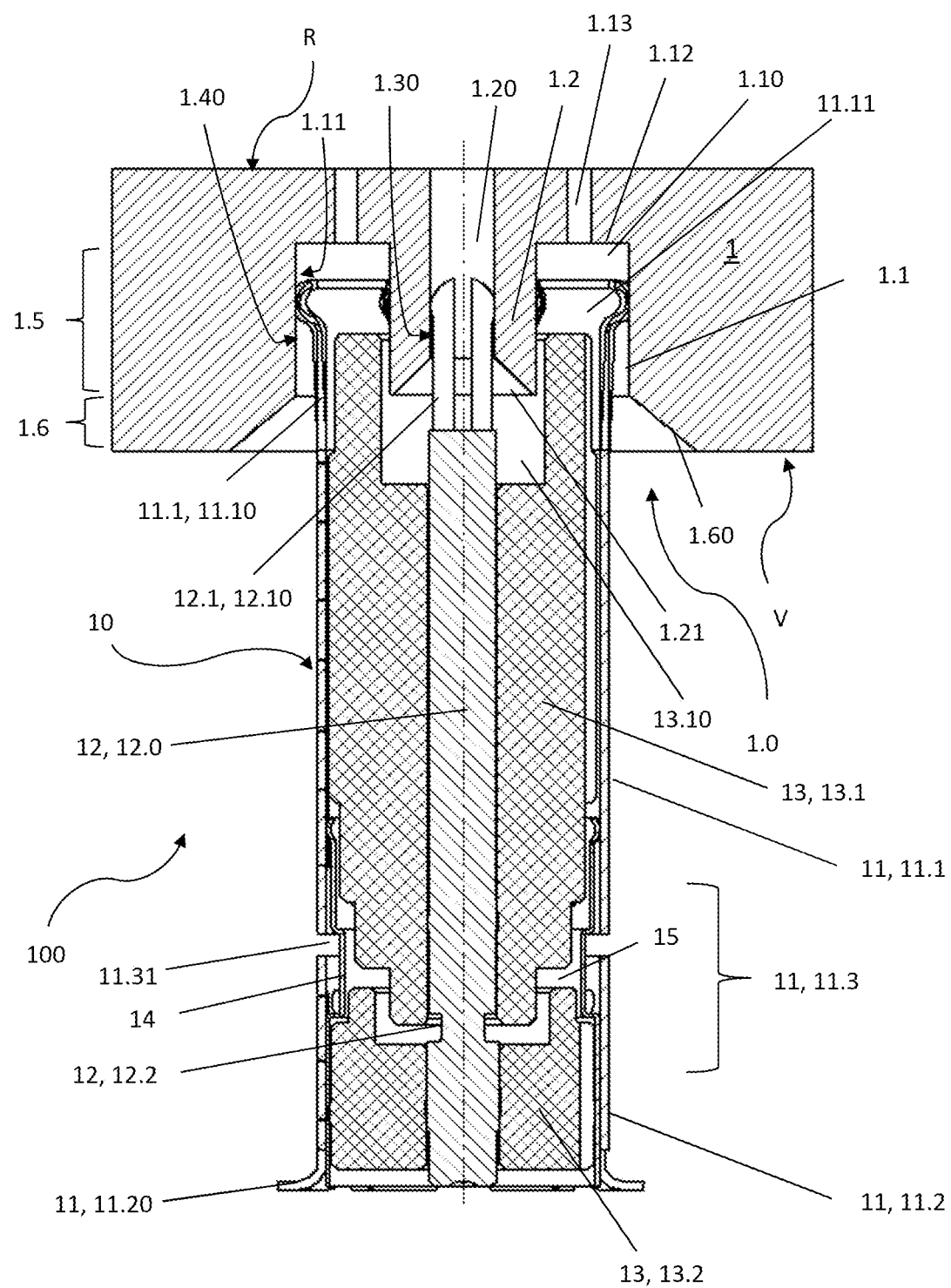
FIG. 2 is a cross-sectional view of the connector arrangement according to FIG. 1, taken through a longitudinal axis of an inner conductor pin of the electrical connector arrangement of FIG. 1.

FIG. 1 shows, in a perspective view, and FIG. 2 shows, in a sectional view, an electrical connector arrangement 100 made from a circuit board 1 with a connector connection 1.0 and a connector 10, which is connected electrically and mechanically by means of the connector connection 1.0 directly to the circuit board 1.

The connector connection 1.0 is designed corresponding to a socket in the circuit board 1 adapted to the connector 10. The connector 10 consists of a sleeve 11 with a dielectric body 13 (see FIG. 2), wherein an inner conductor pin 12 is arranged centrally as an inner conductor 12.0 of the connector 10 in an inner hole in the dielectric body 13. The sleeve 11 forms the outer conductor 11.0 of the connector 10.

The sleeve 11 of the connector 10 consists of multiple sections, namely a plug-side compensation section 11.1 with an end-side contact zone 11.10, with which the contact with the connector connection 1.0 of the circuit board 1 is produced, a holding section 11.2 with an end-side connection flange 11.20, with which a mechanical and electrical connection with another circuit board (not shown in the figures) can be produced, and a bending section 11.3, which connects the compensation section 11.1 with the holding section 11.2. Tolerance compensation that compensates for the lateral offset of the axes between the compensation section 11.1 and the holding section 11.2 is realized by means of the bending section 11.3, in that this bending section 11.3 of the sleeve 11 is formed with multiple slots 11.31 and 11.32 running in the tangential direction.

In addition, for realizing the lateral offset of the axes, it is necessary that the dielectric body 13 of the connector 10 is made from two dielectric partial bodies 13.1 and 13.2. The first dielectric partial body 13.1 extends starting from the contact zone 11.10 of the compensation section 11.1 to partially into the bending section 11.3, while the second dielectric partial body 13.2 connects to the first dielectric partial body 13.1 while forming a gap 15 and extends into the area of the holding section 11.2. The bending section 11.3 is covered by an inner sleeve 14, without limiting the flexibility of the bending section 11.3.

Finally, for realizing the lateral offset of the axes, an adaptation of the inner conductor pin 12 is also required. For this purpose, this inner conductor pin 12 has, in the area of the gap 15, a cross-sectional taper 12.2, which is constructed as a groove.

Figure 3:
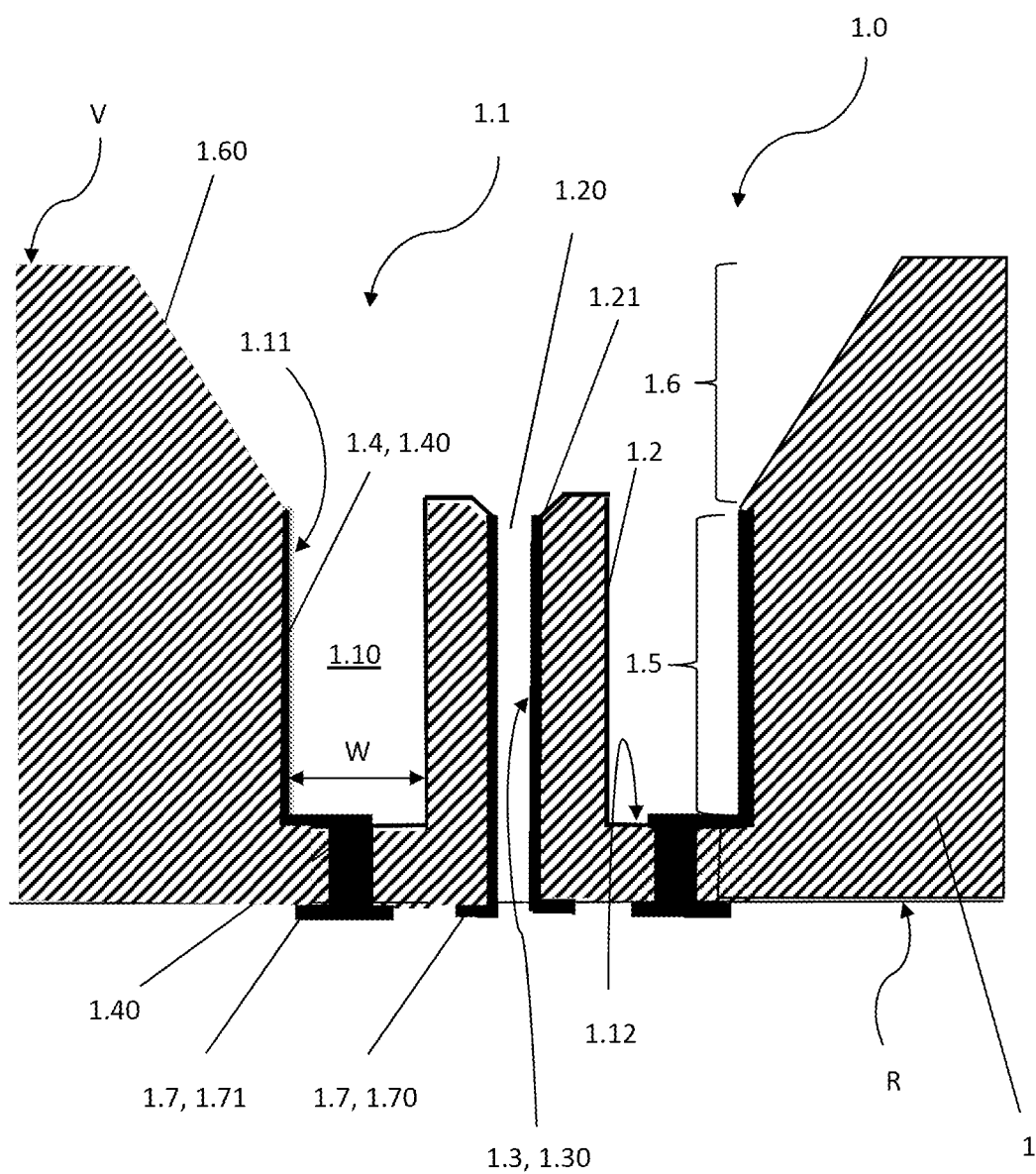
FIG. 3 is a cross-sectional view of the circuit board of FIG. 1, according to the preferred invention with a connector connection.

According to FIGS. 2 and 3, the connector connection 1.0 is realized, starting from a front side V of the circuit board 1, as a blind hole 1.1, wherein the blind hole 1.1 is provided with a chamfer 1.60, so that a funnel-shaped opening is formed. Centrally in the blind hole 1.1 there is a contact pin 1.2, which is surrounded by a circular ring-shaped cylindrical insertion space 1.10. Thus, starting from the bottom 1.12 of the blind hole 1.1, the blind hole 1.1 consists of a contact section 1.5 that forms the insertion space 1.10 and a funnel section 1.6 with the chamfer 1.60. The length of the contact pin 1.2 above the bottom 1.12 thus corresponds to the height of the contact section 1.5.

The contact pin 1.2 has an inner hole 1.20 provided with a chamfer 1.21 with a first contact zone 1.30 as an inner conductor 1.3 of the connector connection 1.0 for contacting the inner conductor 12.0 of the connector 10. The inner conductor 1.3 with the contact zone 1.30 is shown only in FIG. 3. Here, the contact zone 1.30 is located on the lateral surface of the inner hole 1.20 routed up to the reverse side R of the circuit board 1. On the reverse side R of the circuit board 1, the inner conductor 1.3 transitions into a conductor path 1.70 of a conductor path plane 1.7 arranged on the reverse side R of the circuit board 1.

The bottom 1.12 of the insertion space 1.10 is a circular ring-shaped surface that is connected by means of multiple contact holes 1.13 to the reverse side R of the circuit board 1 (see FIG. 2).

According to FIG. 3, a second contact zone 1.40 as inner conductor 1.4 of the connector connection 1.0 is located on the outer lateral surface 1.11 of the insertion space 1.10 and partially on the bottom 1.12, so that also the area of the contact holes 1.13 is covered. The contact holes 1.13 are through-contacted up to the reverse side R of the circuit board 1 and connected to a conductor path 1.71 of the conductor path plane 1.7. This second contact zone 1.40 is connected electrically to the outer conductor 11.0 of the connector 10.

For the direct electrical mechanical connection of the connector 10 to the connector connection 1.0 of the circuit board 1, the plug-side end of the connector 10 with the contact zone 11.10 of the sleeve 11 and the insertion pin 12.1 of the inner conductor pin 12 are inserted into the blind hole 1.1 of the connector connection 1.0. Here, the insertion pin 12.1 is accommodated by the inner hole 1.20 and simultaneously the contact zone 11.10 is accommodated by the insertion space 1.10. Here, the chamfers 1.60 and 1.21 make the manual insertion of the connector 10 into the blind hole 1.1 easier.

To ensure a good electrical connection and also a secure mechanical connection between the connector 10 and the connector connection 1.0, on one hand, the insertion pin 12.1 of the inner conductor pin 12 has cross-shaped slots, so that resilient contact arms 12.10 are formed. The diameter of the inner hole 1.20 is adapted to these contact arms 12.10 such that the contact arms 12.10 are pressed against the resilient force of these contact arms when the insertion pin 12.1 is inserted into the inner hole 1.20.

On the other hand, the width W of the circular ring-shaped cylindrical insertion space 1.10 in the radial direction is adapted to the contact lugs 11.11 of the contact zone 11.10. Multiple contact lugs 11.11, which are each separated by slots running in the longitudinal direction of the connector 10, are spread radially outward for producing a resilient effect and have a circumferential bead at the end. With the insertion of this contact zone 11.10 into the insertion space 1.10, the contact lugs 11.11 are pressed inward radially against the resilient force with their beads making contact at the second contact zone 1.40.

At the end of the first dielectric partial body 13.1 there is a blind hole 13.10, into which the inner conductor pin 12 projects with the insertion pin 12.1. If the connector 10 is connected to the connector connection 1.0, the contact pin 1.2 projects into this blind hole 13.10.

For the circuit board 1 shown in FIG. 3, the conductor path plane 1.7 with the conductor paths 1.70 and 1.71 is located on the reverse side R. This conductor path plane can also be an embedded conductor path plane of a multilayer circuit board.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

LIST OF REFERENCE SYMBOLS

1 Circuit board
1.0 Connector connection
1.1 Blind hole
1.10 Circular ring-shaped cylindrical insertion space
1.11 Outer lateral surface of the insertion space 1.10
1.12 Bottom of the insertion space 1.10
1.13 Contact hole
1.2 Contact pin
1.20 Inner hole of the contact pin 1.2
1.21 Chamfer of the inner hole 1.20
1.3 Inner conductor
1.30 First contact zone
1.4 Second contact zone
1.40 Outer conductor
1.5 Contact section of the insertion space 1.10
1.6 Funnel section of the insertion space 1.10
1.60 Chamfer of the funnel section 1.6
1.7 Conductor path plane
1.70 Conductor path of conductor path plane 1.7
1.71 Conductor path of conductor path plane 1.7
10 Connector
11 Sleeve of the connector 10
11.0 Outer conductor of the connector 10
11.1 Compensation section of the sleeve 11
11.10 Contact zone of the compensation section 11.1
11.11 Contact lug of the contact zone 11.10
11.2 Holding section of the sleeve 11
11.20 Connecting flange of the holding section 11.2
11.3 Bending section of the sleeve 11
11.31 Slot of the bending section 11.3
11.32 Slot of the bending section 11.3
12 Inner conductor pin
12.0 Inner conductor of the connector 10
12.1 Insertion pin of the inner conductor pin 12
12.10 Contact arms of the insertion pin 12.1
12.2 Cross-sectional taper of the inner conductor pin 12
13 Dielectric body of the connector 10
13.1 First dielectric partial body
13.10 Blind hole of the first dielectric partial body 13.1
13.2 Second dielectric partial body
14 Inner sleeve of the connector 10
15 Gap
100 Electrical connector arrangement
R Reverse side of circuit board 1
V Front side of circuit board 1
W Radial width of circular ring-shaped cylindrical insertion space 1.0

The invention claimed is:

1. An electrical connector arrangement for a circuit board with a connector connection for directly contacting with a connector wherein the connector connection is formed on a front side of the circuit board, the electrical connector arrangement comprising:
 a contact pin that is arranged centrally in a blind hole of the circuit board while forming a circular ring-shaped cylindrical insertion space and has an inner hole with a first contact zone of an inner conductor configured for contacting an inner conductor of the connector, and
 a second contact zone of an outer conductor of the circuit board arranged in the insertion space configured for contacting an outer conductor of the connector.

2. The electrical connector arrangement according to claim 1, wherein the inner conductor is routed to a conductor path plane on a reverse side of the circuit board opposite the front side of the circuit board and is connected electrically to an inner conductor path of the conductor path plane.

3. The electrical connector arrangement according to claim 1, wherein the second contact zone is arranged at least on an outer lateral surface of the circular ring-shaped cylindrical insertion space.

4. The electrical connector arrangement according to claim 1, wherein the outer conductor is routed to a conductor path plane on a reverse side of the circuit board opposite the front side of the circuit board and is connected electrically to an outer conductor path of the conductor path plane.

5. The electrical connector arrangement according to claim 1, wherein the inner hole of the contact pin is formed with a radially widening chamfer at an end proximate the front side.

6. The electrical connector arrangement according to claim 1, wherein a radial width of the circular ring-shaped cylindrical insertion space is adapted to a sleeve forming the outer conductor of the connector for creating a resilient plug-in contact.

7. The electrical connector arrangement according to claim 1, in which the insertion space has a contact section with the second contact zone and a funnel section with a chamfer that widens radially in a direction of the front side of the circuit board.

8. The electrical connector arrangement according to claim 7, in which the contact pin is formed with a length of the contact section of the insertion space.

9. The electrical connector arrangement according to claim 1, wherein the connector is connected to the connector connection of the circuit board, wherein
- the first contact zone of the inner conductor of the connector connection is connected to the connector through the inner conductor formed as an inner conductor pin for insertion into the inner hole of the contact pin of the connector connection,
- the connector has the outer conductor formed as a sleeve with a contact zone for contacting the second contact zone of the connector connection, and
- the connector has a dielectric body with an inner hole of the dielectric body for holding the inner conductor pin, wherein the dielectric body is arranged in the sleeve.

10. The electrical connector arrangement according to claim 9, in which the sleeve of the connector has, on an end opposite the contact zone, a connection flange for mechanical connection with another circuit board.

* * * * *